United States Patent
Visconti et al.

(10) Patent No.: US 11,467,012 B2
(45) Date of Patent: Oct. 11, 2022

(54) METHOD FOR RECALIBRATING A MICROMECHANICAL SENSOR, AND RECALIBRATEABLE SENSOR

(71) Applicant: Robert Bosch GmbH, Stuttgart (DE)

(72) Inventors: Andrea Visconti, Munich (DE); Matthias Meier, Reutlingen (DE); Ruslan Khalilyulin, Munich (DE); Thomas Zebrowski, Reutlingen (DE); Wolfram Geiger, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 267 days.

(21) Appl. No.: 16/969,042

(22) PCT Filed: Mar. 7, 2019

(86) PCT No.: PCT/EP2019/055636
§ 371 (c)(1),
(2) Date: Aug. 11, 2020

(87) PCT Pub. No.: WO2019/219258
PCT Pub. Date: Nov. 21, 2019

(65) Prior Publication Data
US 2021/0033437 A1    Feb. 4, 2021

(30) Foreign Application Priority Data

May 16, 2018   (DE) .......................... 102018207573.5

(51) Int. Cl.
*G01D 18/00*          (2006.01)
(52) U.S. Cl.
CPC .................. *G01D 18/006* (2013.01)
(58) Field of Classification Search
CPC .. G01D 18/006; G01D 18/008; G01D 18/002; G01R 33/0035; G01L 27/002; G01P 21/00
See application file for complete search history.

(56) References Cited

U.S. PATENT DOCUMENTS 10,989,729 B2 *  4/2021  Sato ..................... G01P 15/18
2014/0083164 A1  3/2014  Homeijer et al.
(Continued)

FOREIGN PATENT DOCUMENTS

DE         10321962 A1     12/2004
DE      102009046807 A1     5/2011

OTHER PUBLICATIONS

International Search Report for PCT/EP2019/055636, dated Jun. 19, 2019.

*Primary Examiner* — Alvaro E Fortich
*Assistant Examiner* — Zannatul Ferdous
(74) *Attorney, Agent, or Firm* — Norton Rose Fulbright US LLP; Gerard Messina (57) ABSTRACT

Recalibrating a micromechanical sensor. The sensor is assigned a signal processing device for correcting the sensor signal on the basis of at least one previously determined initial trim value that is selected such that, given a defined sensor excitation, a production-related deviation of the sensor signal from a target sensor signal is compensated. The method for recalibrating the sensor includes: applying a defined electrical test excitation signal to the sensor structure, acquiring the corresponding sensor response signal, ascertaining a trim correction value for the at least one initial trim value on the basis of a previously determined relation between the sensor response signal and the trim correction value, and determining at least one current trim value for correcting the sensor signal, the determination of the at least one current trim value taking place on the basis of the at least one initial trim value and the ascertained trim correction value.

16 Claims, 3 Drawing Sheets

(56) References Cited

U.S. PATENT DOCUMENTS

2014/0260508 A1    9/2014  Dar et al.
2021/0002126 A1*   1/2021  Alessi ..................... G01D 3/08

* cited by examiner

METHOD FOR RECALIBRATING A MICROMECHANICAL SENSOR, AND RECALIBRATEABLE SENSOR

FIELD

The present invention relates to measures for recalibrating a micromechanical sensor whose sensor structure includes at least one deflectable sensor structure element for detecting and converting a physical input variable into an electrical sensor signal.

BACKGROUND INFORMATION

A micromechanical sensor can be, for example, an inertial sensor for detecting accelerations or a rate of rotation. Generally, the sensor structure of an inertial sensor includes at least one spring-mounted seismic mass whose deflections are acquired. In the case of an acceleration sensor, these deflections result directly from the acceleration that is to be acquired. In the case of a rotational rate sensor, the seismic mass is actively excited to oscillate in an excitation plane for the purposes of detection. Rotational movements of the sensor about an axis oriented parallel to the plaintiff excitation and perpendicular to the direction of excitation can then be acquired as deflections of the seismic mass perpendicular to this plane of excitation, because such rotational movements cause a Coriolis force that acts on the seismic mass perpendicular to the plane of excitation. In particular if such an inertial sensor is to detect accelerations or rates of rotation in more than only one spatial direction, the sensor structure frequently includes not just one, but a plurality of seismic masses whose suspensions are then each particularly flexible in a different spatial direction.

However, the measures used according to the present invention for recalibration are, for example, also applicable to micromechanical magnetic field sensors and pressure sensors. The sensor structure of magnetic field sensors likewise includes at least one spring-suspended seismic mass. Here, the deflections of the seismic mass are caused by the Lorentz force that acts on a conductor through which current is flowing in a magnetic field. Inside the sensor structure of micromechanical pressure sensors, there is standardly a pressure-sensitive sensor membrane whose deflections are acquired and converted into electrical sensor signals.

The micromechanical sensors described herein are equipped with first and second circuit means (i.e., first and second circuit elements). The first circuit means are used in order to apply a defined electrical test excitation signal to the sensor structure, which causes a test deflection of the sensor structure element. With the aid of the second circuit means, the test deflection of the sensor structure element can be acquired and converted into a corresponding electrical signal, designated in the following as electrical sensor response signal $S_{el}$. Here it is to be noted that for some sensor types and test excitation signals, the sensor response signal can also be acquired using the circuit means provided for acquiring the sensor signal during sensor operation.

In a specific realization, the first and second circuit means include capacitor electrodes situated on the sensor structure in a suitable manner. In this case, as test excitation signal for example a defined direct voltage can easily be applied to the capacitor electrodes of the first circuit means in order to bring about an electrostatic deflection of the sensor structure element. The sensor response signal $S_{el}$ can then very easily be acquired as a change in capacitance between the capacitor electrodes of the second circuit means. Of course, the defined electrical test excitation signal can also be applied to the sensor structure in some other way than capacitively, and the sensor response signal $S_{el}$ can also be acquired in some other way than capacitively, if corresponding first and second circuit means are provided. Thus, for example an inductive test excitation and/or an inductive acquisition of sensor response signal $S_{el}$ would also be possible.

Moreover, a signal processing device is provided that carries out a correction of the sensor signal on the basis of at least one previously determined initial trim value Cal(0). The signal processing device is assigned to the sensor at least for this purpose. It does not necessarily have to be a component of the sensor, i.e., located in the sensor. The correction described above of the sensor signal can also be carried out by a signal processing device that is physically separate from the sensor, for example by the host processor of the device in which the sensor is installed.

The initial trim value Cal(0) is selected such that a production-related deviation of the sensor signal from a target sensor signal, given a defined sensor excitation, is compensated. Standardly, the initial trim value Cal(0) is determined by the manufacturer at the end of production (end-of-line). For this purpose, defined stimuli are applied to the sensors. The initial trim value Cal(0) is then determined by evaluating the corresponding response signals.

This end-of-line compensation carried out by the manufacturer is particularly accurate if the sensors are stimulated with the physical input variables that are to be acquired, and a part-specific initial trim value Cal(0) is determined. For this purpose, an acceleration sensor is exposed to a defined acceleration, a rotational rate sensor is exposed to a defined rotational movement, a magnetic field sensor is exposed to a defined magnetic field, and a pressure sensor has a defined pressure applied to it. This procedure is very complex, time-intensive, and cost-intensive.

German Patent Application No. DE 10 2009 046 807 A1 describes that the end-of-line compensation of a micromechanical sensor of the type considered here be carried out exclusively on the basis of electrical test excitation signals and the corresponding sensor response signals. For this purpose, the electrical test excitation signals are selected such that the respective sensor response signal reflects the sensitivity of the sensor as a function of production process-related geometrical parameters of the sensor structure, such as layer thicknesses and edge loss. The sensitivity of the sensor is then determined on the basis of the sensor response signals. For this purpose, a correlation function is required that describes the relation between the electrical and physical sensitivity, i.e., between the sensor sensitivity relative to the electrical test excitation signal and relative to a physical excitation. Such a correlation function is standardly ascertained uniquely before the actual final compensation through measurements made on a multiplicity of sensors of the same type, designated characterizing parts. The scatter of the sensor sensitivity of these characterizing parts is based exclusively on production-related deviations in the sensor structure, such as fluctuations of the layer thicknesses and of the edge loss, and/or deviations in the packaging. According to German Patent Application No. DE 10 2009 046 807 A1, the sensor sensitivity determined in this way is then used to compensate the sensors at the end of the production process, i.e., to ascertain an initial trim value Cal(0) for the correction of the sensor signal.

As stated, in the determination of the correlation function according to German Patent Application No. DE 10 2009 046 807 A1 only those measurements at characterizing parts are taken into account that cover production-related influences on the sensor sensitivity. Other influences, occurring after the production process is finished, on the sensor sensitivity are not taken into account and correspondingly cannot be compensated in the correction of the sensor signal. This applies in particular to changes in the sensor sensitivity that occur due to the mounting of the sensor on a circuit board or some other bearer, or to changes of the sensor sensitivity caused by aging and environmental influences such as humidity, temperature fluctuations, etc.

SUMMARY

Using the end-of-line compensation, essentially only production-related deviations from the sought sensor sensitivity can be compensated. However, it has turned out that the sensitivity of a micromechanical sensor of the type under consideration here changes frequently over its lifespan, both due to installation conditions and in the field.

An object of the present invention is to provide measures by which the required sensor sensitivity can be ensured over the entire useful life of a sensor. For this purpose, a recalibration of the sensors under consideration here is provided that can be carried out after the end-of-line compensation and also during sensor operation in the field, so that drifts in the sensor sensitivity due both to installation conditions and to environmental and aging influences can be compensated.

In accordance with an example embodiment of the present invention, for the recalibration of a micromechanical sensor of the type under consideration here, a method is provided that includes the following steps:
a. applying a defined electrical test excitation signal to the sensor structure,
b. acquiring the corresponding sensor response signal $S_{el}(i)$,
c. ascertaining a trim correction value $\Delta Cal(i)$ for the at least one initial trim value $Cal(0)$ on the basis of a previously determined relation between the sensor response signal $S_{el}$ and the trim correction value $\Delta Cal$, and
d. determining at least one current trim value $Cal(i)$ for correcting the sensor signal, the determination of the at least one current trim value $Cal(i)$ taking place on the basis of the at least one initial trim value $Cal(0)$ and the ascertained trim correction value $\Delta Cal(i)$.

Here, i designates the point in time of the recalibration, or indicates which (i.e., the first, second, third, etc.) recalibration is taking place.

The proposed recalibration method in accordance with an example embodiment of the present invention is based on the end-of-line compensation of the sensor, i.e., on the initial trim value $Cal(0)$ with which production-related deviations from a sought sensor sensitivity are compensated. In the context of the proposed recalibration method, only a trim correction value $\Delta Cal(i)$ for the initial trim value $Cal(0)$ is determined with which the changes in the sensor sensitivity in the field are taken into account, i.e., parameters that influence the sensor sensitivity that do not occur until after the production process.

The example recalibration method according to the present invention is independent of the way in which the end-of-line compensation has been carried out, i.e., how the initial trim value $Cal(0)$ was ascertained. This compensation may have been carried out using electrical test excitation signals, as described in German Patent Application No. DE 10 2009 046 807 A1. However, the compensation may also have been carried out on the basis of calibration measurements for which defined stimuli of the input variable to be acquired were used to excite the sensor, in order to then ascertain the initial trim value $Cal(0)$ by evaluating the corresponding sensor signals.

In order to ascertain the trim correction value $\Delta Cal(i)$, according to the example embodiment of the present invention, a defined electrical test excitation signal is applied to the sensor structure in order to acquire the corresponding sensor response signal $S_{el}(i)$. The sensor response signal $S_{el}$ is also referred to as the electrical sensitivity of the sensor, because it represents the sensitivity of the sensor structure to an electrical test excitation signal. In accordance with the example embodiment, the recalibration method according to the present invention, a determination is made of the relation between the electrical sensitivity $S_{el}$ of the sensor and the physical sensitivity $S_{ph}$ of the sensor, i.e., the sensitivity of the sensor structure to stimuli of the input variable of the sensor that is to be acquired. This physical sensitivity $S_{ph}$ is represented by the corresponding sensor signal. The relation between the electrical sensitivity $S_{el}$ and the physical sensitivity $S_{ph}$ is determined beforehand. Because the recalibration according to the present invention is to be used to compensate installation-related drifts and/or drifts of the sensor sensitivity over the lifespan, it is recommended to base this determination on measurements of sensors that have been exposed to the conditions that are to be expected that impair sensor sensitivity, e.g., a soldering process for mounting the sensor on a circuit board, temperature variations and humidity conditions that are to be expected in the field, etc. In any case, the measurements for determining the correlation between the electrical sensitivity $S_{el}$ and the physical sensitivity $S_{ph}$ should map, in some suitable form, the influencing parameters that are to be compensated by the recalibration according to the present invention. This correlation can be ascertained empirically, on the basis of measurements of a multiplicity of sensors of the same type. Alternatively, however, the relation between the electrical sensitivity $S_{el}$ and the physical sensitivity $S_{ph}$ could also be determined on the basis of a mathematical model.

According to the present invention, the sensor response signal $S_{el}(i)$ is evaluated on the basis of the previously determined relation between the electrical sensitivity $S_{el}$ and the physical sensitivity $S_{ph}$, and the current trim correction value $\Delta Cal(i)$ is determined.

Thus, the present invention provides a new type of application, or design, of electrical test excitation signals, with the goal of correcting deviations of the sensor sensitivity from an initial sensor sensitivity that result from installation and/or are caused by environmental influences or by aging.

The use of the example method according to the present invention also makes it possible to operate with very high accuracy, i.e., low deviation from a sought sensor sensitivity, those micromechanical sensors that are relatively susceptible to stress over their lifespan, in particular mechanical stress, temperature stress, and humidity influences. As a result, such sensors can also be used in sensor applications having comparatively high performance demands. As a result, thanks to the measures provided according to the present invention, compromises can also be made in the optimization of a sensor structure or sensor packaging with regard to the susceptibility of the sensor to lifespan stress, in favor of other parameters, such as production costs, robustness, noise, etc.

Advantageously, the ascertaining of the trim correction value $\Delta Cal(i)$ is based on the change $\Delta S_{el}(i)$ in the sensor response signal $S_{el}(i)$ relating to a part-specific sensor response signal $S_{el}(0)$ that was previously determined for the test excitation signal, i.e. the change in the electrical sensor sensitivity $\Delta S_{el}(i)$ with regard to a part-specific electrical initial sensitivity $S_{el}(0)$. This change is advantageously defined as:

$$\Delta S_{el}(i)=[S_{el}(i)-S_{el}(0)]/S_{el}(0)$$

A higher degree of accuracy in the determination of the trim correction value $\Delta Cal(i)$ can be achieved through the relation to the part-specific sensor initial sensitivity $S_{el}(0)$, which can be easily determined during the final measurements.

It has turned out that the scatter of the sensitivity drifts over the lifespan for a sensor batch is comparatively small. Therefore, the correlation between the electrical sensitivity $S_{el}$, or $\Delta S_{el}$, and the physical sensitivity $S_{ph}$, or $\Delta S_{ph}$, and the trim correction value $\Delta Cal$ can already be determined relatively well empirically, on the basis of measurements made on a multiplicity of sensors of the same type. The trim correction value $\Delta Cal(i)$ can be ascertained in this way with a comparatively high degree of accuracy.

In many applications, the ascertaining of the trim correction value $\Delta Cal(i)$ can be based on an essentially linear relation having the form:

$$\Delta Cal(i)a1*S_{el}(i)+b1 \text{ or}$$

$$\Delta Cal(i)a2*S_{el}(i)+b2,$$

where a1, b1, or, respectively, a2, b2, are previously determined characterizing constants. In such a case, the relation between the sensor response signal $S_{el}$, or $\Delta S_{el}$, and the trim correction value $\Delta Cal$ can be stored very easily in the form of the characterizing constants a1, b1 or a2, b2. The calculation of the trim correction value $\Delta Cal(i)$ on the basis of the sensor response signal $S_{el}(i)$ or $\Delta S_{el}(i)$ is then just as easy.

However, there are applications in which other functions have to be chosen for the description of the relation between the electrical sensitivity $S_{el}$, or $\Delta S_{el}$, and the physical sensitivity $S_{ph}$, or $\Delta S_{ph}$, and the trim correction value $\Delta Cal$, in order to achieve a sought accuracy of the trim correction value $\Delta Cal(i)$. Thus, the relation between the electrical sensitivity $S_{el}$, or $\Delta S_{el}$, and the physical sensitivity $S_{ph}$, or $\Delta S_{ph}$, can for example also be approximated by a higher-order function.

In the present context, particularly to be noted are also functions that take into account at least one further influencing variable $Par_j$ in the ascertaining of the trim correction value $\Delta Cal(i)$. The trim correction value $\Delta Cal(i)$ can then be described as $$\Delta Cal(i)=f(S_{el}(i),Par_j) \text{ or}$$

$$\Delta Cal(i)=f(\Delta S_{el}(i),Par_j).$$

Here, in accordance with the example embodiment of the present invention, of particular importance are part-specific parameters that can be determined ahead of time during the final measurements, and temporally variable influencing variables that can be acquired in real time during sensor operation, and are also referred to as real-time parameters. Part-specific parameters that can be determined ahead of time are for example the electrical sensor initial sensitivity $S_{el}(0)$ and the initial trim value $Cal(0)$. Further examples of such part-specific influencing variables in a rotational rate sensor are raw sensitivity and quadrature. The current sensor temperature is an example of a real-time parameter. All of these parameters $Par_j$ may enter into the ascertaining of the trim correction value $\Delta Cal(i)$ additively, factorially, and/or exponentially.

Advantageously, the recalibration according to the example embodiment of the present invention of the sensor can be initiated by a start signal actively triggered by the user. This is appropriate for example when the recalibration is to be carried out after the sensor is installed in an end device, but before its first commissioning.

In addition, in many applications it turns out to be advantageous if the recalibration is initiated by at least one defined sensor event. Thus, a rotational rate sensor can for example always be recalibrated according to the present invention when the sensor is in a state of rest and is therefore temporarily deactivated.

In addition, it may be appropriate to automatically repeat the recalibration according to the present invention at defined time intervals during sensor operation, for example in order to compensate the influence of varying ambient conditions, such as temperature, humidity, etc., on the sensor sensitivity.

In a variant embodiment of the method according to the present invention, it is also possible to carry out a situation-dependent ascertaining of the trim correction value $\Delta Cal(i)$ by basing the ascertaining of the trim correction value $\Delta Cal(i)$ on various previously determined relations $$\Delta Cal(i)=f_{inst}(S_{el}(i)) \text{ or } \Delta Cal(i)=f_{run}(S_{el}(i))$$

or $$\Delta Cal(i)=f_{inst}(\Delta S_{el}(i)) \text{ or } \Delta Cal(i)=f_{run}(\Delta S_{el}(i))$$

depending on the situation, namely installation or sensor operation.

In this specific embodiment of the present invention, for a recalibration after sensor installation a correlation between the electrical sensitivity $S_{el}$ and the physical sensitivity $S_{ph}$ may be used that was ascertained based on measurements made on already-installed sensors. For a recalibration of the sensor in the field, in contrast to this, a correlation between the electrical sensitivity $S_{el}$ and the physical sensitivity $S_{ph}$ could be used that was ascertained on the basis of measurements made on sensors that have in addition also been exposed to temperature variations and humidity conditions corresponding to those that are to be expected in the field.

In addition to the method described above for recalibrating a micromechanical sensor of the type under consideration here, the present invention also provides that a signal processing device of a micromechanical sensor of the type here under consideration be designed such that it can access a previously determined, stored relation between the sensor response signal $S_{el}$ and a trim correction value $\Delta Cal$ for the at least one initial trim value $Cal(0)$, and it can determine a current trim value $Cal(i)$ for the correction of the sensor signal on the basis of the at least one initial trim value $Cal(0)$ and the ascertained trim correction value $\Delta Cal(i)$, in particular according to the recalibration method according to the present invention.

As already explained in connection with the recalibration method according to the present invention, a correlation between the sensor response signal $S_{el}$, or $\Delta S_{el}$, and a trim correction value $\Delta Cal$, on which the recalibration is based, is determined previously, i.e., for example during the end-of-line measurements. This correlation relation need not necessarily be stored locally on the sensor. It can for example also be stored in a storage device managed by the manufacturer, or on the host processor of the end device in which the sensor is installed. In the example embodiment, what is essential is that the signal processing device assigned to the sensor has access to this correlation relation and to the initial trim value Cal(0).

In a possible specific embodiment, the sensor according to the present invention can include at least one storage device for the at least one previously determined initial trim value Cal(0) and/or for at least one sensor-specific parameter $Par_j$, determined before sensor operation, that is to be taken into account in the ascertaining of the trim correction value $\Delta Cal(i)$, and/or for the previously determined electrical sensor initial sensitivity $S_{el}(0)$ and/or for the at least one currently ascertained trim correction value $\Delta Cal(i)$ and/or for the currently determined trim value $Cal(i)$. Alternatively or in addition to this, the sensor according to the present invention can also be equipped with at least one storage device for the previously determined relation between the sensor response signal $S_{el}$, or $\Delta S_{el}$, and the trim correction value $\Delta Cal$.

In an advantageous specific example embodiment, the sensor according to the present invention is in addition equipped with at least one interface via which the recalibration method according to the present invention can be initiated.

DRAWINGS

As mentioned above, the measures according to the present invention for recalibrating are not limited to micromechanical sensors of a particular detection type, as long as the sensor structure includes at least one deflectable sensor structure element for detecting a physical input variable and converting it into an electrical signal. Thus, the measures according to the present invention are equally suitable for the recalibration of micromechanical rotational rate sensors, acceleration sensors, magnetic field sensors, or pressure sensors. Advantageous specific embodiments and developments of the present invention are explained in more detail below in relation to the example of a micromechanical rotational rate sensor, on the basis of the Figures.

DETAILED DESCRIPTION OF EXAMPLE EMBODIMENTS

Figure 1:
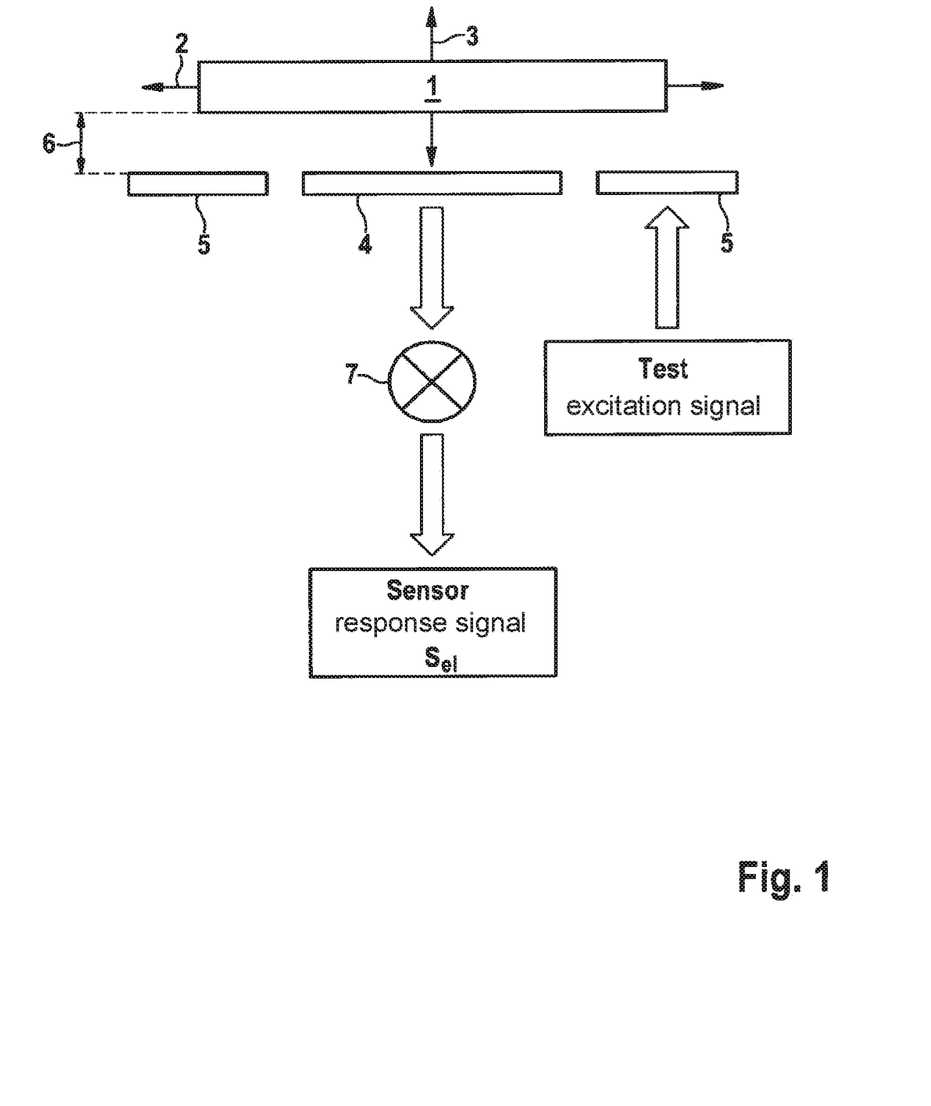
FIG. 1 shows a schematic representation of the main components of a rotational rate sensor that are used for the realization of the present invention.

The sensor structure of a micromechanical rotational rate sensor includes at least one seismic mass as detection element, connected to the rest of the sensor structure via a spring system. The detection element is designated 1 in the schematic representation of FIG. 1. The rotational rate sensor is equipped with a drive with the aid of which the spring-mounted detection element 1 can be set into oscillation with a particular excitation frequency $\omega_A$. The type and functioning of the drive is not important for the realization of the present invention, for which reason they are not explained and shown in more detail in FIG. 1. FIG. 1 indicates only the direction of this driven oscillation, by arrows 2. This direction is referred to in the following as the x direction 2.

When there is a rotational movement of detection element 1, oscillating in x direction 2, about an axis oriented in the y direction (here perpendicular to the plane of the image), a Coriolis force $F_c$ occurs. This Coriolis force $F_c$ acts in the z direction (indicated in FIG. 1 by arrows 3), and is proportional to the rate of rotation $\Omega$ of the rotational movement. Through this Coriolis force $F_c$, detection element 1 oscillating in x direction 2 is additionally excited to an oscillation in z direction 3. The frequency of this oscillation in z direction 3 corresponds to the excitation frequency $\omega_A$, but the oscillation is phase-shifted by 90° relative to the excitation oscillation of detection element 1 in x direction 2. The oscillating movement of detection element 1 in z direction 3 is acquired as sensor signal, and is supplied to a signal processing device 7 assigned to the sensor in order to determine therefrom the rate of rotation $\Omega$ of the rotational movement.

In the exemplary embodiment explained here, the acquisition of the sensor signal is done capacitively, using a detection electrode 4 that is situated opposite detection element 1 in z direction 3, at a distance 6. Together with detection element 1, it forms a detection capacitor. Distance 6 varies periodically with the oscillating movement, caused by Coriolis force $F_c$, of detection element 1 in z direction 3. The associated change in capacitance of the detection capacitor is acquired as sensor signal.

The sensor signal of such a micromechanical rotational rate sensor is in addition influenced by a number of further, mostly undesirable, parameters. For example, fluctuations in the layer thicknesses of the sensor structure, which occur due to the MEMS production process, play a role. The packaging can also have an effect on the sensor signal if for example it causes mechanical tensions to be carried into the sensor structure.

In order to counteract falsifications of the sensor signal resulting from production factors, micromechanical rotational rate sensors are, in practice, compensated or calibrated at the manufacturer. There, an initial trim value Cal(0) is determined with the aid of which, for a defined sensor excitation, a production-related deviation of the sensor signal from a target sensor signal can be compensated. This sensor trimming works particularly well if a part-specific initial trim value Cal(0) is ascertained for each sensor on the basis of defined mechanical stimuli. For this purpose, each sensor has to be subjected to a defined mechanical rotational movement in order to then determine an individual initial trim value Cal(0) from the corresponding sensor signals.

This procedure has only very limited suitability for compensating disturbing influences that occur after installation and during sensor operation, such as installation-related mechanical tensions in the sensor structure, and/or environmental influences. According to the present invention, it is therefore provided to recalibrate the sensor after its installation and/or in the field, so that the sensor signal can also be purified of disturbing influences that occur later and that change over the operating life of the sensor.

For this purpose, the rotational rate sensor shown schematically in FIG. 1 is equipped with test electrodes 5 that here are configured in a plane with detection electrode 4, but are situated laterally thereto. By applying a defined voltage between detection element 1 and test electrodes 5, a defined electrical test excitation in z direction 3 can be exerted on detection element 1. Here, the corresponding sensor response signal $S_{el}$ is easily acquired as a change of capacitance between detection electrode 4 and detection element 1. Sensor response signal $S_{el}(i)$ is also referred to as the electrical sensitivity of the sensor at measurement time i.

In the exemplary embodiment described here, a DC voltage U is applied between detection element 1 and test electrodes 5, so that the corresponding electrostatic force acts in z direction 3, i.e., in the detection direction, that is in the direction of Coriolis force $F_c$. As a result of the configuration and geometry of test electrodes 5, this force is modulated with the driven oscillation movement of detection element 1. As a result, this electrostatic force has the same frequency and also the same phase as the driven oscillating movement. However, it is phase-shifted by 90° to the Coriolis force $F_c$ caused by a rotational movement. That is, through the application of the DC voltage U, a quadrature force is electrically induced. The resulting deflection of detection element 1 can be separately acquired through demodulation of the sensor signal. The amplitude of this portion of the sensor signal is then outputted as static sensor response signal $S_{el}$.

Advantageously, the electrical sensitivity $S_{el}(i)$ ascertained in this way is set into relation to an electrical initial sensitivity $S_{el}(0)$ of the sensor that has been determined in part-specific fashion, for example during final measurements at the manufacturer.

Therefore, in the exemplary embodiment described here the relative change of the electrical sensitivity $\Delta S_{el}(i)$ is always considered, where $$\Delta S_{el}(i) := \frac{S_{el}(i) - S_{el}(0)}{S_{el}(0)}$$

According to an example embodiment of the present invention, it is a correction value $\Delta \text{Cal}(i)$ for the initial trim value Cal(0) is determined using the thus ascertained electrical sensor sensitivity, or the relative change in the electrical sensor sensitivity $\Delta S_{el}(i)$. This is done on the basis of a previously determined correlation function between the electrical sensor sensitivity $S_{el}(i)$, or $\Delta S_{el}(i)$, and the physical sensor sensitivity $S_{ph}(i)$, or $\Delta S_{ph}(i)$; in the case of a rotational rate sensor, this is thus the sensor sensitivity to rotational movements.

Here it is to be noted that in the recalibration method according to the present invention, in principle any test excitation signal may be used, as long as for the recalibration of a particular sensor the same, defined test excitation signal is always used that was also used as the basis for determining the correlation between the electrical sensor sensitivity and the physical sensor sensitivity. For the exemplary embodiment described above, this means that, for example, a defined alternating voltage signal could also be applied, as test excitation signal, to the capacitor system of test electrode 5 and detection element 1 in order to modulate the deflection of detection element 1. In each case, the movement or deflection of detection element 1 and the corresponding sensor response signal $S_{el}$ permit inferences to be made concerning the performance properties of the sensor, and in particular concerning changes in the sensor sensitivity with regard to the initial sensor sensitivity determined at the manufacturer.

Figure 2:
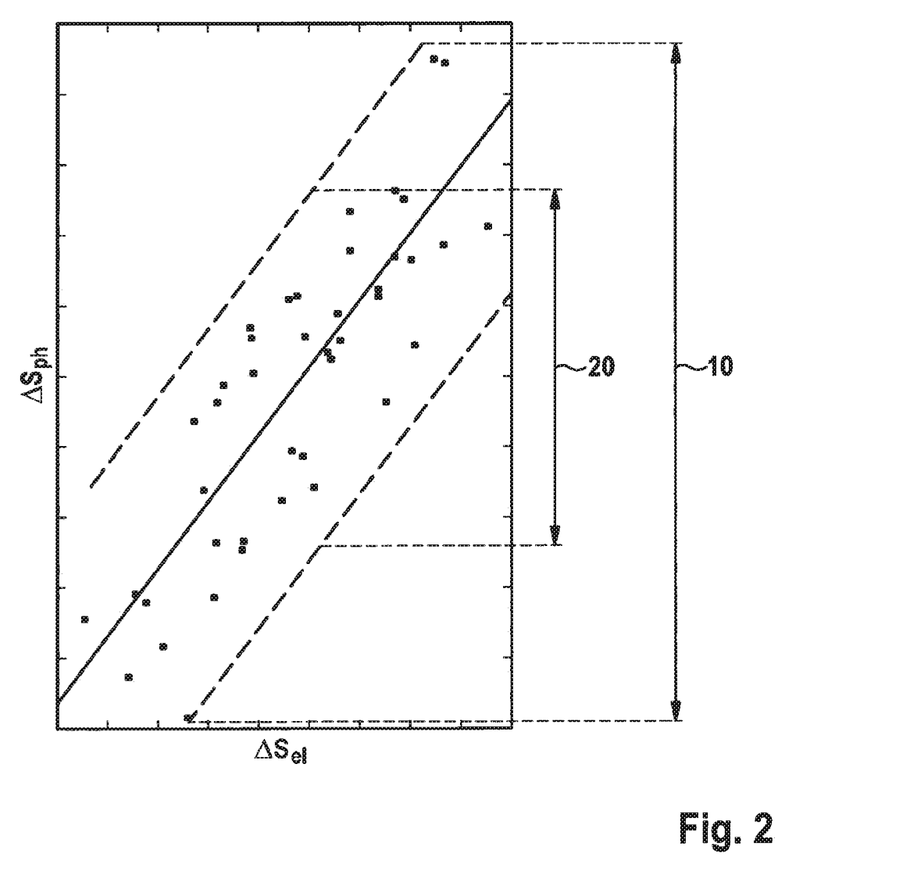
FIG. 2 shows a diagram with the results of measurements of characterizing parts in order to determine the correlation between the relative change in the electrical sensor sensitivity $\Delta S_{el}$ and the relative change in the physical sensor sensitivity $\Delta S_{ph}(i)$.

In the exemplary embodiment described here, the determination of the trim correction value $\Delta \text{Cal}(i)$ is based on the correlation, shown in FIG. 2, between the relative change in the electrical sensor sensitivity $\Delta S_{el}$ and the relative change in the physical sensor sensitivity $\Delta S_{ph}(i)$, the physical initial sensitivity $S_{ph}(0)$ corresponding to the target value of the sensor sensitivity after the initial trimming of the sensor, and being defined as 1. In the example embodiment, care is to be taken that, in this case, what have to be correlated with one another are not the absolute sensitivities, but rather only their changes due to soldering influences or lifespan influences.

For the determination of this correlation, in preparation for mass production measurements are carried out of the relative change of the electrical sensor sensitivity $\Delta S_{el}$ and the corresponding relative change in the physical sensor sensitivity $\Delta S_{ph}(i)$ for an adequately large number of characterizing parts. These parts will have undergone a soldering process in order to ascertain the change in the physical sensor sensitivity due to soldering stress. In the measurement diagram of FIG. 2, the measurement results are plotted for the relative change in the electrical sensor sensitivity $\Delta S_{el}$ and the corresponding relative change in the physical sensor sensitivity $\Delta S_{ph}$. On the basis of these measurement points, a linear correlation function was determined:

$$\Delta S_{ph} = f(\Delta S_{el}) = \text{const} \cdot \Delta S_{el}$$

FIG. 2 illustrates that, already on the basis of such a linear scaling function—without taking into account further input parameters—a significant reduction in the sensitivity drift can be achieved. The drift in the physical sensitivity $\Delta S_{ph}$ without recalibration is shown here as double arrow 10, while the sensitivity drift after the recalibration according to the present invention is shown by double arrow 20.

From the previously described measurements of characterizing parts, it may also result that the correlation between the electrical sensor sensitivity $\Delta S_{el}$ and the physical sensor sensitivity $\Delta S_{ph}$ is better approximated by a higher-order function, or that the sensor sensitivity is a function of one, or also a plurality of, further influencing variables $\text{Par}_j$. If these are part-specific influencing variables $\text{Par}_j$, which can be ascertained for example in the end-of-line compensation, it is recommended to store these in a storage device of the sensor, or at least in a storage device to which the signal processing device of the sensor has access. In the case of a rotational rate sensor, for example the raw sensitivity or quadrature may be such part-specific influencing variables $\text{Par}_j$.

In some cases, however, it may also be appropriate to take into account so-called real-time parameters in the description of the correlation between the electrical sensor sensitivity $\Delta S_{el}$ and the physical sensor sensitivity $\Delta S_{ph}$. These are influencing variables $\text{Par}_j$ measured in the field, such as the sensor temperature.

Figure 3:
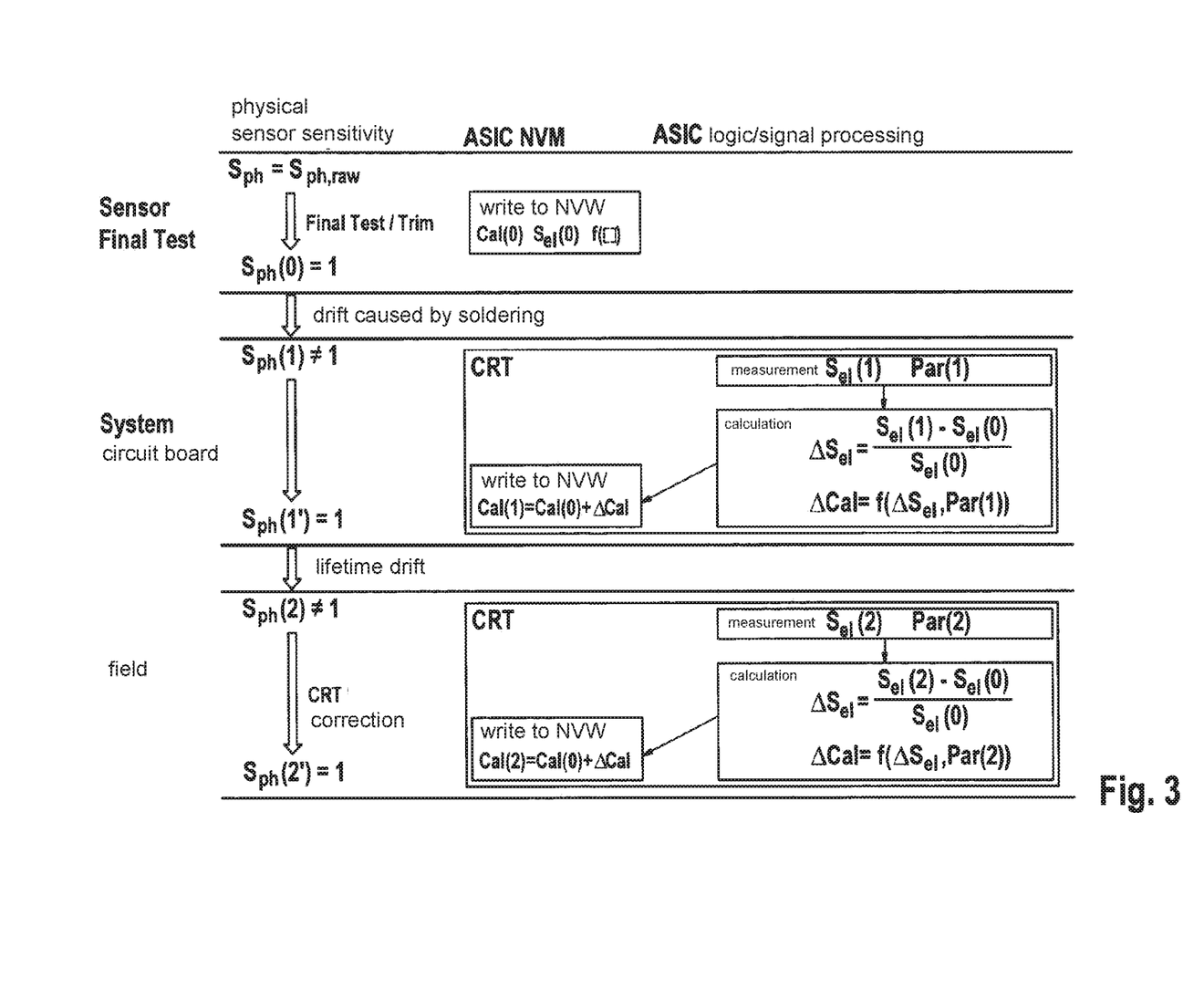
FIG. 3 shows a diagram illustrating the example method according to the present invention.

FIG. 3 illustrates the procedure for the determination according to an example embodiment of the present invention of a correction value $\Delta \text{Cal}(i)$ for the initial trim value $\Delta \text{Cal}(0)$ taking as a basis a previously determined correlation function f( ) between the electrical sensor sensitivity $\Delta S_{el}$ and the physical sensor sensitivity $\Delta S_{ph}$.

First, at the manufacturer, in a "sensor final test"-phase, an initial trim value Cal(0) for calibrating the sensor is determined, so that the sought physical sensor sensitivity is achieved. The physical initial sensor sensitivity is then determined as $S_{ph}(0) = 1$. By applying the defined electrical test excitation signal U to the thus calibrated sensor, in addition the electrical initial sensor sensitivity $S_{el}(0)$ is acquired.

The initial trim value Cal(0), the electrical initial sensor sensitivity $S_{el}(0)$, and the correlation function f( ) are stored in a storage device NVM (non-volatile memory) of the sensor or of the associated ASIC.

The installation of the sensor on a circuit board, which requires a soldering process, very frequently results in a change in the physical initial sensor sensitivity, so that $S_{ph}(1) \neq 1$. Here, $S_{ph}(1)$ stands for the physical sensor sensitivity in a first measurement after the soldering process. For the compensation of the soldering-related change in the physical sensor sensitivity, the defined electrical test excitation signal U is applied to the rotational rate sensor, in order to first acquire the electrical sensor sensitivity $S_{el}(1)$ after the soldering process. Using $S_{el}(1)$, the relative change in the physical sensor sensitivity $\Delta S_{el}(1)$ is then calculated, in order also to determine the relative change in the physical sensor sensitivity $\Delta S_{ph}(1)$, using the correlation function f( ). In this way, finally a corresponding trim correction value $\Delta Cal(1)$ can also be ascertained and a further influencing variable Par(1) is also taken into account here. The compensation of the deviation of the sensor sensitivity from a sought sensor sensitivity then takes place using a new trim value Cal(1), where $$Cal(1)=Cal(0)+\Delta Cal(1).$$

In the exemplary embodiment shown here, the recalibration occurring to the present invention is also designated the CRT (Component Re-Trim) correction.

The method according to the present invention also permits a recalibration of the sensor in the field. Here, environmental influences and aging may result in a change in the physical initial sensor sensitivity, so that $S_{ph}(2) \neq 1$. Here, $S_{ph}(2)$ stands for the physical sensor sensitivity in a second measurement carried out during the use of the sensor in the field. For the recalibration, the defined electrical test excitation signal U is again applied to the rotational rate sensor in order to first acquire the current electrical sensor sensitivity $S_{el}(2)$. Using this, the relative change in the physical sensor sensitivity $\Delta S_{el}(2)$ with regard to the electrical initial sensor sensitivity $S_{el}(0)$ is then calculated in order to as well determine the relative change in the physical sensor sensitivity $\Delta S_{ph}(2)$ using the correlation function f( ). In the ascertaining of the corresponding trim correction value $\Delta Cal(2)$, here a further influencing variable Par(2) is also taken into account. The compensation of the deviation of the sensor sensitivity from the sought sensor sensitivity then takes place using a new trim value Cal(2), where:

$$Cal(2)=Cal(0)+\Delta Cal(2).$$

Using the recalibration according to the present invention, the sensor sensitivity is thus always brought back to the initial sensor sensitivity, i.e., the physical sensitivity is always corrected, as far as possible, to its initial factory value by the recalibration according to the present invention. The method according to the present invention enables, in a simple manner, the compensation of the influence of installation-related mechanical stresses on the measurement signal, and is therefore preferably applied after the rotational rate sensor is installed in an environment of use. However, during sensor operation it is also still possible to perform recalibration in order to compensate the influence of changing environmental conditions on the measurement signal. For this purpose, the electrical excitation of the detection mass can take place for example at regular time intervals, or can be automatically triggered by defined sensor events, such as shortly before the switching off of the rotational rate sensor after the sensor has received the switch-off signal. Finally, the recalibration according to the present invention can also be initiated by the user of the device in which the rotational rate sensor is installed.

What is claimed is:

1. A method for recalibrating a sensor, the sensor having a micromechanical sensor structure having at least one deflectable sensor structure element for detecting and converting a physical input variable into an electrical sensor signal, a first circuit element for applying a defined electrical test excitation signal to the micromechanical sensor structure that causes a test deflection of the deflectable sensor structure element, and a second circuit element for acquiring the test deflection of the deflectable sensor structure element as an electrical sensor response signal, the sensor being assigned a signal processing device for correcting the sensor signal based on at least one previously determined initial trim value that is selected such that, given a defined sensor excitation, a production-related deviation of the sensor signal from a target sensor signal is compensated, the method the method for recalibrating the sensor comprising the following steps:
   a. applying a defined electrical test excitation signal to the micromechanical sensor structure;
   b. acquiring the corresponding sensor response signal;
   c. ascertaining a trim correction value for the at least one initial trim value based on a previously determined relation between the sensor response signal and the trim correction value; and
   d. determining at least one current trim value for correcting the sensor signal, the determination of the at least one current trim value taking place based on the at least one initial trim value and the ascertained trim correction value.

2. The method as recited in claim 1, wherein the ascertaining of the trim correction value is based on a change $\Delta S_{el}(i)$ of the sensor response signal $S_{el}(i)$ in relation to a sensor response signal $S_{el}(0)$ determined previously for the test excitation signal, using the following formula:

$$\Delta S_{el}(i)=[S_{el}(i)-S_{el}(0)]/S_{el}(0).$$

3. The method as recited in claim 1, wherein the relation between the sensor response signal or a change of the sensor response signal, relating to the sensor response signal determined previously for the test excitation signal and the trim correction value, on which the ascertaining of the trim correction value is based, is previously determined empirically based on measurements carried out on a multiplicity of sensors of the same type as the sensor.

4. The method as recited in claim 2, wherein the ascertaining of the trim correction value $\Delta Cal(i)$ is based on a linear relation having the form $$\Delta Cal(i) a1*S_{el}(i)+b1 \text{ or}$$

$$\Delta Cal(i) a2*S_{el}(i)+b2,$$

where a1, b1, or, respectively, a2, b2, are previously determined characterizing constants.

5. The method as recited in claim 2, wherein in the ascertaining of the trim correction value $\Delta Cal(i)$ at least one additional influencing variable $Par_j$ is taken into account, so that $$\Delta Cal(i)=f(S_{el}(i),Par_j) \text{ or}$$

$$\Delta Cal(i)=f(\Delta S_{el}(i),Par_j).$$

where $f(S_{el}(i), Par_j)$ and $f(\Delta S_{el}(i), Par_j)$ are the correlation functions.

6. The method as recited in claim 5, wherein the at least one influencing variable $Par_j$ is a previously determined part-specific parameter, $Par_j$ being the sensor response signal $S_{el}(0)$ previously determined for the test excitation signal and/or the previously determined initial trim value Cal(0).

7. The method as recited in claim 5, wherein the at least one influencing variable $Par_j$ is a parameter capable of being acquired during sensor operation.

8. The method as recited in claim 1, wherein the recalibration of the sensor is initiated by a start signal that is actively triggered by a user, and/or is initiated by at least one defined sensor event, and/or is automatically initiated at defined time intervals.

9. The method as recited in claim 1, wherein the recalibration of the sensor is initiated after the sensor is installed in a device.

10. The method as recited in claim 1, wherein the recalibration of the sensor is initiated during a sensor operation.

11. The method as recited in claim 2, wherein the ascertaining of the trim correction value $\Delta Cal(i)$ takes place in situation-dependent fashion in that the ascertaining of the trim correction value $\Delta Cal(i)$ is based on different previously determined relations $$\Delta Cal(i)=f_{inst}(S_{el}(i)) \text{ or } \Delta Cal(i)=f_{run}(S_{el}(i))$$

or $$\Delta Cal(i)=f_{inst}(\Delta S_{el}(i)) \text{ or } \Delta Cal(i)=f_{run}(\Delta S_{el}(i)) \text{ depending on an installation or sensor operation.}$$

where $f_{inst}(S_{el}(i))$, $f_{run}(S_{el}(i))$, $f_{inst}(\Delta S_{el}(i))$, $f_{run}(\Delta S_{el}(i))$ are the correlation functions.

12. A sensor, comprising:
a. a micromechanical sensor structure having at least one deflectable sensor structure element for detecting and converting a physical input variable into an electrical sensor signal;
b. a first circuit element configured to apply a defined electrical test excitation signal to the micromechanical sensor structure that causes a test deflection of the deflectable sensor structure element; and
c. a second circuit element configured to acquire the test deflection of the deflectable sensor structure element as an electrical sensor response signal;

wherein the sensor is assigned a signal processing device configured to correct the sensor signal based on at least one previously determined initial trim value that is selected such that, given a defined sensor excitation, a production-related deviation of the sensor signal from a target sensor signal is compensated;
wherein the signal processing device is configured to:
access a previously determined, stored relation between the sensor response signal and a trim correction value for the at least one initial trim value; and
determine a current trim value for the correction of the sensor signal based on the at least one initial trim value and the ascertained trim correction value.

13. The sensor as recited in claim 12, wherein at least one storage device is provided to store:r
a. the at least one previously determined initial trim value Cal(0) and/or
b. at least one sensor-specific parameter determined before the sensor is operated, that is to be taken into account in the ascertaining of the trim correction value; and/or
c. the sensor response signal previously determined for the test excitation signal;
and/or
d. the at least one currently ascertained trim correction value, and/or
e. the determined current trim value.

14. The sensor as recited in claim 12, wherein at least one storage device is provided to store the previously determined relation between the sensor response signal and a trim correction value for the at least one initial trim value.

15. The sensor as recited in claim 12, wherein at least one interface is provided for a trigger signal for initiating a recalibration of the sensor including the determination of the current trim value for the correction of the sensor signal.

16. The sensor as recited in claim 12, wherein the sensor is a micromechanical rotational rate sensor, or an acceleration sensor, or a magnetic field sensor, or a pressure sensor.

* * * * *